US010464510B2

(12) United States Patent
Sumida (10) Patent No.: US 10,464,510 B2
(45) Date of Patent: Nov. 5, 2019

(54) POWER SUPPLY DEVICE AND METHOD FOR PRODUCING THE SAME

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Tatsuya Sumida, Yokkaichi (JP)

(73) Assignees: SUMITOMO WIRING SYSTEMS, LTD., Mie (JP); AUTONETWORKS TECHNOLOGIES, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/096,131

(22) PCT Filed: May 1, 2017

(86) PCT No.: PCT/JP2017/017127
§ 371 (c)(1),
(2) Date: Oct. 24, 2018

(87) PCT Pub. No.: WO2017/199748
PCT Pub. Date: Nov. 23, 2017

(65) Prior Publication Data
US 2019/0135207 A1    May 9, 2019

(30) Foreign Application Priority Data

May 19, 2016  (JP) .................................. 2016-100598

(51) Int. Cl.
*B60R 16/033*  (2006.01)
*H01R 4/48*  (2006.01)
(Continued)

(52) U.S. Cl.
CPC ........... *B60R 16/033* (2013.01); *H01G 11/10* (2013.01); *H01G 11/76* (2013.01); *H01G 11/82* (2013.01);
(Continued)

(58) Field of Classification Search
CPC . B60R 16/33; H01R 4/48; H05K 1/18; H01G 11/10; H01G 11/76; H01G 11/82
(Continued)

(56) References Cited

U.S. PATENT DOCUMENTS

2003/0194832 A1*  10/2003  Lopata .............. H01L 23/49805
                                                438/108
2010/0124693 A1    5/2010  Kosugi et al.
(Continued)

FOREIGN PATENT DOCUMENTS

JP   2007-281187 A   10/2007
JP   2008-124244 A    5/2008
(Continued)

OTHER PUBLICATIONS

Jul. 25, 2017 International Search Report issued in International Patent Application No. PCT/JP2017/017127.

*Primary Examiner* — Xiaoliang Chen
(74) *Attorney, Agent, or Firm* — Oliff PLC (57) ABSTRACT

A power supply device that includes a plurality of electricity storage elements each including lead terminals; a conductive connector connected to the lead terminals; a circuit board including a conductive path; a conductive relay terminal electrically connected to the conductive path, the connector being disposed so as to be in contact with the relay terminal; and a resin holder configured to hold the plurality of electricity storage elements, wherein the holder includes an electricity storage element holder configured to hold the electricity storage elements, a connecting member holder
(Continued)

configured to hold the connector, and a fitting groove into which the lead terminals can be fitted, and the connecting member holder is formed so as to traverse the fitting groove.

5 Claims, 10 Drawing Sheets (51) Int. Cl.
*H01G 11/10* (2013.01)
*H01G 11/76* (2013.01)
*H01G 11/82* (2013.01)
*H01G 11/84* (2013.01)
*H05K 1/18* (2006.01)
*B60L 50/50* (2019.01)
*B60K 6/28* (2007.10)
*H01R 25/16* (2006.01)

(52) U.S. Cl.
CPC .............. *H01G 11/84* (2013.01); *H05K 1/184* (2013.01); *B60K 6/28* (2013.01); *B60L 50/50* (2019.02); *B60Y 2200/91* (2013.01); *B60Y 2200/92* (2013.01); *B60Y 2400/11* (2013.01); *H01R 25/162* (2013.01); *H05K 2201/10015* (2013.01); *H05K 2201/10272* (2013.01)

(58) Field of Classification Search
USPC ....... 174/260; 417/423.1; 438/108; 439/816; 257/678, 690
See application file for complete search history.

(56) References Cited

U.S. PATENT DOCUMENTS

| | | | |
|---|---|---|---|
| 2015/0280333 A1* | 10/2015 | Annen | H01R 4/48 417/423.1 |
| 2017/0040583 A1 | 2/2017 | Kuboki et al. | |
| 2018/0123431 A1* | 5/2018 | Kawaguchi | H01L 25/07 |

FOREIGN PATENT DOCUMENTS

| | | |
|---|---|---|
| JP | 2013-098206 A | 5/2013 |
| JP | 2013-165067 A | 8/2013 |
| JP | 2013-247100 A | 12/2013 |
| JP | 2014-239095 A | 12/2014 |
| WO | 2015/170642 A1 | 11/2015 |

* cited by examiner

POWER SUPPLY DEVICE AND METHOD FOR PRODUCING THE SAME

This application is the U.S. National Phase of PCT/JP2017/017127 filed May 1, 2017, which claims priority to JP 2016-100598 filed May 19, 2016, the entire disclosure of which is incorporated herein by reference.

BACKGROUND

The technique disclosed herein relates to a power supply device including a plurality of electricity storage elements, and a method for producing the same.

Conventionally, vehicles such as automobiles may employ, separate from a battery serving as the main power supply device, auxiliary power supply devices including an electricity storage element such as a capacitor, as an emergency power supply, a sub-power supply, or the like that is used if a failure occurs in the battery. In such auxiliary power supply devices, a plurality of electricity storage elements are connected in series or parallel for use, in view of the temperature environment during operation, the voltage, the service life. To reduce the size of the power supply device, it is common for the plurality of electricity storage elements to be arranged so as to be parallel to a circuit board, and a space for mounting an electronic component is provided between the electricity storage elements and the circuit board.

Here, for example, in the case of the capacitor module described in JP 2013-98206A below, the connection between a conductive circuit formed on the circuit board and electricity storage elements is achieved by bending lead wires extending from capacitors (electricity storage elements) into an L-shape toward the circuit board, then passing the lead wires through through holes of the circuit board, and soldering the lead wires. Alternatively, in the case of the electronic component described in JP 2008-124244A below, lead wires guided out from an electronic component body (electricity storage element) are connected to compliant pins, and the compliant pins are pressed into through holes of the circuit board, thus achieving connection to the conductive circuit.

SUMMARY

However, when a lead wire is connected to the conductive path through reflow soldering as in the case of JP 2013-98206A, there is a concern that the capacitor may be affected by heat during heating when passed through a reflow furnace. Furthermore, for the capacitor module described in JP 2013-98206A, the lead wires of six capacitors are passed through the respective corresponding through holes and soldered. Accordingly, the operation needs to be performed for the number of times corresponding to the number of lead wires, resulting in the problem that much time and effort is involved.

Also, in the case of the electronic component described in JP 2008-124244A, the compliant pins connected to the lead wires of the electronic component are individually pressed into the through holes of the circuit board. Accordingly, when a plurality of electronic components are used, the same number of compliant pins as the number of lead wires is required, which results not only in an increase in the burden of connection and pressing operations, but also in the need for precise positioning between the through holes of the circuit board and the electronic components. If a positional shift occurs, stress is exerted on the edges of the through holes of the circuit board, which may lead to a reduction in the long-term connection reliability.

An exemplary aspect of the disclosure simplifies the operation of electrically connecting lead terminals of electricity storage elements to a conductive path of a circuit board in a power supply device including a plurality of electricity storage elements.

A power supply device disclosed herein is a power supply device including: a plurality of electricity storage elements each including lead terminals; a conductive connector connected to the lead terminals; a circuit board including a conductive path; a conductive relay terminal electrically connected to the conductive path, the connector being disposed so as to be in contact with the relay terminal; and a resin holder configured to hold the plurality of electricity storage elements, wherein the holder includes an electricity storage element holder configured to hold the electricity storage elements, a connecting member holder configured to hold the connector, and a fitting groove into which the lead terminals can be fitted, and the connecting member holder is formed so as to traverse the fitting groove.

With the above-described configuration, the relay terminal can be connected to the circuit board in a state in which the electricity storage elements are not connected, thus preventing the electricity storage elements from being affected by heat or vibrations when connecting the relay terminal to the conductive path.

For example, when connection between the relay terminal and the conductive path is achieved through reflow soldering, the relay terminal is attached to the circuit board in advance, and is reflow soldered to the conductive path, and thereafter, the connector connected to the lead terminal of the electricity storage element is brought into contact with the relay terminal. Thus, the lead terminal and the conductive path can be connected so as to prevent the electricity storage elements from being affected by heat when performing reflow soldering on the relay terminal. Since this allows the relay terminal for connection to be soldered simultaneously when the electronic component is mounted, soldering in a subsequent step will not be necessary, thus making it possible to perform the soldering step in one go. Consequently, a solder testing step can also be performed in one go, and therefore the number of man-hours can also be significantly reduced.

Alternatively, even when the relay terminal and the conductive path are are connected by pressing the relay terminal into the circuit board, only the relay terminal can be pressed into a through hole of the circuit board, and thereafter the connector connected to the lead terminal of the electricity storage elements may be placed in contact with the relay terminal. Thus, it is possible to prevent the electricity storage elements from being affected by vibrations while pressing in the relay terminal. The operation of pressing only the relay terminal into the circuit board can be performed significantly easier than connecting the lead terminal connected to the electricity storage elements to the circuit board while positioning the lead terminal, and therefore the operability is improved.

With the above-described configuration, the lead terminals of the electricity storage elements and the conductive circuit of the circuit board are connected via the connector and the relay terminal, and therefore variations in dimensions between the members and changes in dimensions during expansion and contraction can be absorbed at the connection locations between the members. This eliminates the need for precise positioning between the electricity storage elements and the circuit board, thus making it possible to significantly improve the mounting operability, and to reduce the stress exerted on edge portions of the solder and the through hole. It is not necessary to pass a lead terminal through a through hole of the circuit board, and to perform a forming step of bending the lead terminal into an L-shape. Accordingly, the operation of connecting a lead terminal to the conductive path can be further simplified.

In the power supply device disclosed herein, at least one of the connector and the relay terminal may include a fitting portion into which a part of the other of the connector and the relay terminal can be press-fitted.

With the above-described configuration, by press-fitting the connector and the relay terminal so that they are attached, the connector can be placed so as to be in reliable contact with the relay terminal in the power supply device, thus simplifying the operation of connecting the lead terminals of the electricity storage elements to the conductive path of the circuit board, while ensuring the connection reliability.

In the power supply device disclosed herein, the connector may be connected to a plurality of the lead terminals, and the number of the relay terminals may be smaller than the number of the lead terminals.

With the above-described configuration, the number of relay terminals is reduced by achieving connection between the plurality of lead terminals by using the connector, thus significantly reducing the number of connection locations between the connector and the relay terminal, and the number of connection locations between the conductive path and the relay terminal, as compared with the number of lead terminals. This makes it possible to reduce the number of components, and to significantly simplify the operation of electrically connecting the lead terminals to the conductive path, as compared with a configuration in which a plurality of lead terminals are separately connected to the conductive path of the circuit board.

The power supply device disclosed herein may further include a resin holder configured to hold the plurality of electricity storage elements, wherein the holder may include an electricity storage element holder configured to hold the electricity storage elements, and a fitting groove into which the lead terminals can be fitted.

With the above-described configuration, the operation of making a connection to the conductive path is facilitated by fixing the electricity storage elements and the lead terminals to the holder. Moreover, it is also possible to suppress the influence exerted on the electricity storage elements and the lead terminal by vibrations or the like when mounting the power supply device to a vehicle, thus enhancing the durability and the connection reliability.

In the power supply device disclosed herein, the holder may further include a connecting member holder configured to hold the connector, the connecting member holder being formed so as to traverse the fitting groove.

With the above-described configuration, the connector connected to the lead terminals can also be held by the holder that holds the electricity storage elements and the lead terminals. Accordingly, the relative locations between the electricity storage elements, the lead terminals, and the connector can be defined, thus inhibiting a situation in which excess stress is exerted on the connection between the lead terminals and the connector. For example, the electricity storage elements from which the lead terminals are guided out and the connector connected to the lead terminal are held by the holder, and all of these components may be unitized as an electricity storage element unit, and the circuit board on which the relay terminal is connected to the conductive path may be handled as a circuit board unit. Then, a power supply device can be produced by simply attaching the two units to each other such that the connector and the relay terminal come into contact with each other.

In the power supply device including the holder disclosed herein, a pair of the lead terminals may be guided out from each of the electricity storage elements so as to have extension lengths different from each other, and the fitting groove may be formed to have a length corresponding to the extension lengths of the lead terminals.

With the above-described configuration, to which of the fitting groove portions the lead terminals should be fitted into can be easily determined, and it is therefore possible to suppress an erroneous operation, thus improving the operability.

The power supply device including the holder disclosed herein, may further include a cover configured to be locked to the holder, wherein the cover may be configured to: abut against the plurality of electricity storage elements held by the holder; and be locked to the holder so as to cover a connection between the lead terminals and the connector.

With the above-described configuration, the electricity storage elements are pressed so as to suppress resonance caused by vibrations or the like, and the connections between the lead terminal and the connector are covered so as to suppress the protrusion of the connections caused by vibrations. In addition, the stress exerted on the base portion of the lead terminals can be reduced, thus further improving the connection reliability against vibrations.

Alternatively, the present specification discloses a method for producing a power supply device, including: after making a circuit board unit by connecting a conductive relay terminal to a conductive path formed on a surface of a circuit board, placing, in a connecting member holder provided on a resin holder, a conductive connector in a state in which the connector is in contact with the relay terminal; placing, in an electricity storage element holder provided in the holder, a plurality of electricity storage elements, and connecting a plurality of lead terminals individually guided out from each of the plurality of electricity storage elements to the connector by the lead terminals into a fitting groove portion provided on the holder so as to traverse the connecting member holder.

With the above-described configuration, it is possible to connect the relay terminal to the circuit board in a state in which the electricity storage elements are not connected, thus preventing the electricity storage elements from being affected by heat or vibrations when connecting the relay terminal to the conductive path. By placing the connector so as to be in contact with the relay terminal connected to the conductive path in the circuit board unit, and connecting the lead terminals of the electricity storage elements to the connector, it is possible to connect the lead terminals to the conductive path without performing precise positioning. For example, while attaching, to a circuit board unit, a resin holder including a connecting member holder, a fitting groove, and an electricity storage element holder, holding a connector by using the connecting member holder formed so as to traverse the fitting groove, and fitting the lead terminals of the electricity storage element into the fitting groove so as to be connected to the connector, the electricity storage elements may be held by the electricity storage element holder. Thus, a power supply device having excellent connection reliability can be produced, while defining the relative locations between the members.

According to the technique described herein, it is possible to to simplify the operation of electrically connecting lead terminals of electricity storage elements to a conductive path of a circuit board in a power supply device including a plurality of electricity storage elements.

DETAILED DESCRIPTION OF EMBODIMENTS

Figure 1:
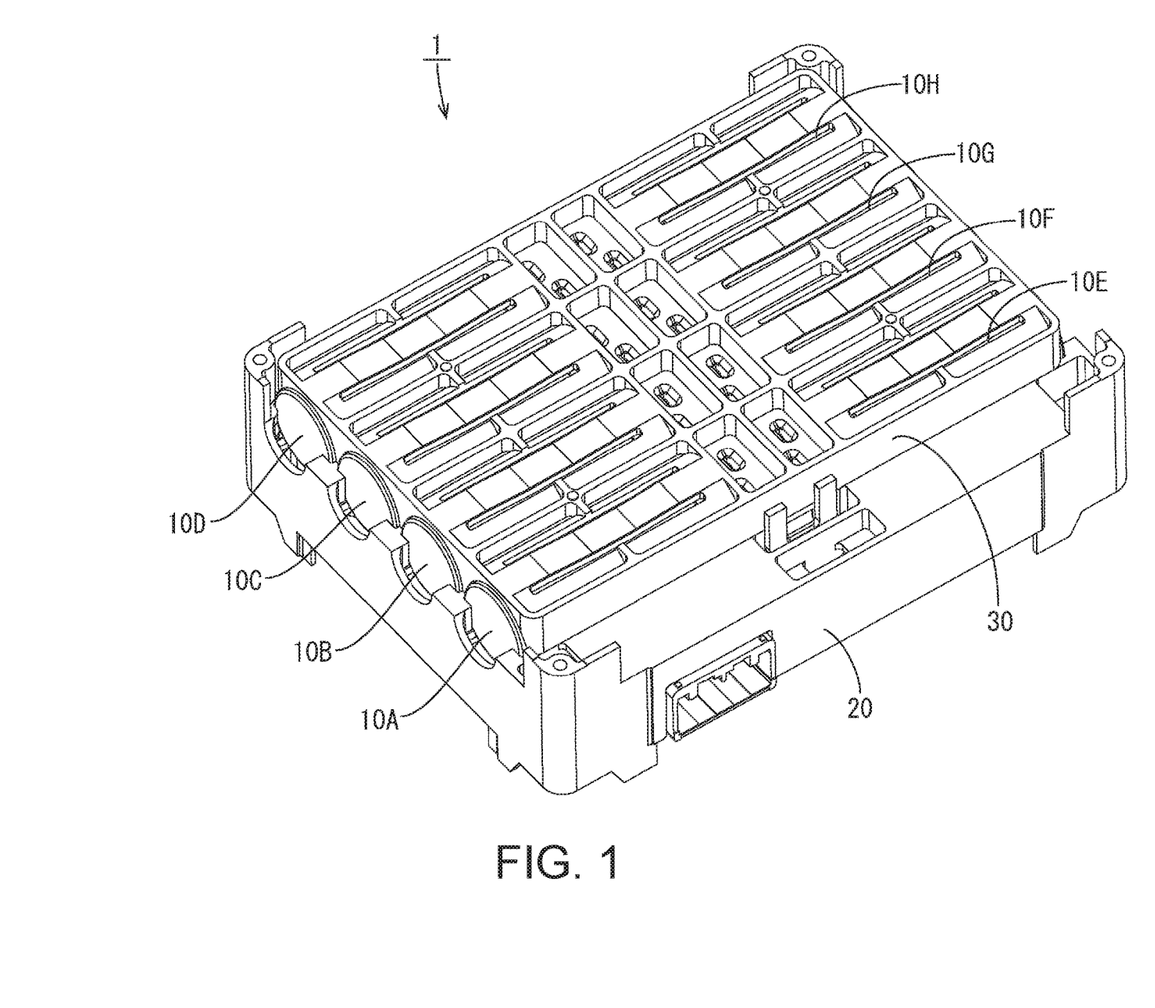
FIG. 1 is an external perspective view of an auxiliary power supply device according to an embodiment.

In the following, an auxiliary power supply device 1 (an example of the power supply device) according to an embodiment will be described with reference to FIGS. 1 to 10. The auxiliary power supply device 1 can be mounted to a vehicle such as an electric car or a hybrid car, separately from a battery serving as a main power supply, and supply power to a load (a motor, a lamp, or the like) if a failure occurs in the main power supply, or can supply power during an idling stop, for example. In the following description, the upper front side in FIG. 1 is assumed to be the upper side, the right front side is assumed to be the front side, and the left front side is assumed to be the left side. For a plurality of identical members, a reference numeral may be assigned to only some of the members, and reference numerals omitted for the other members.

Auxiliary Power Supply Device 1

Figure 8:
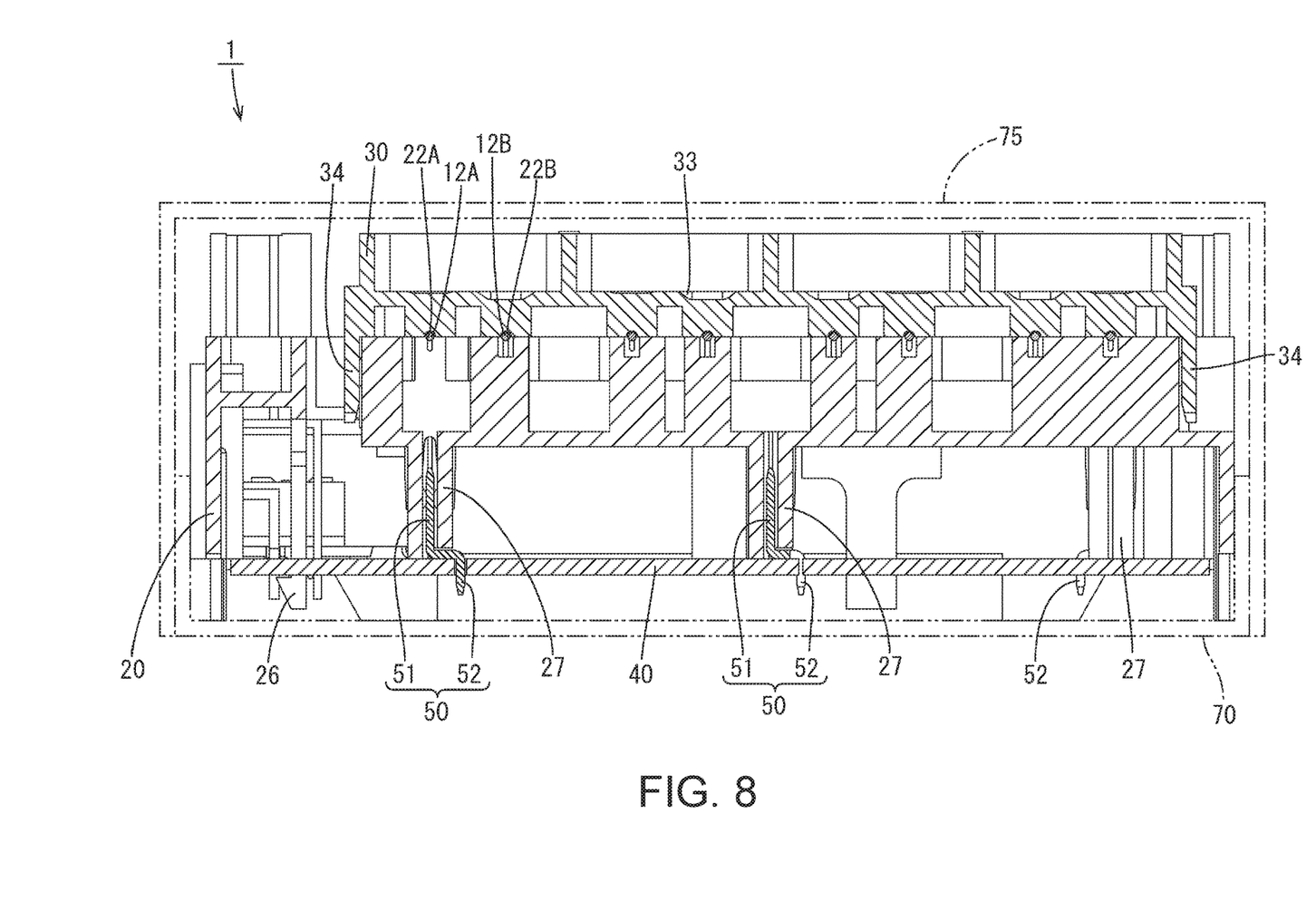
FIG. 8 is a cross-sectional view taken along the line A-A in FIG. 7.
Figure 9:
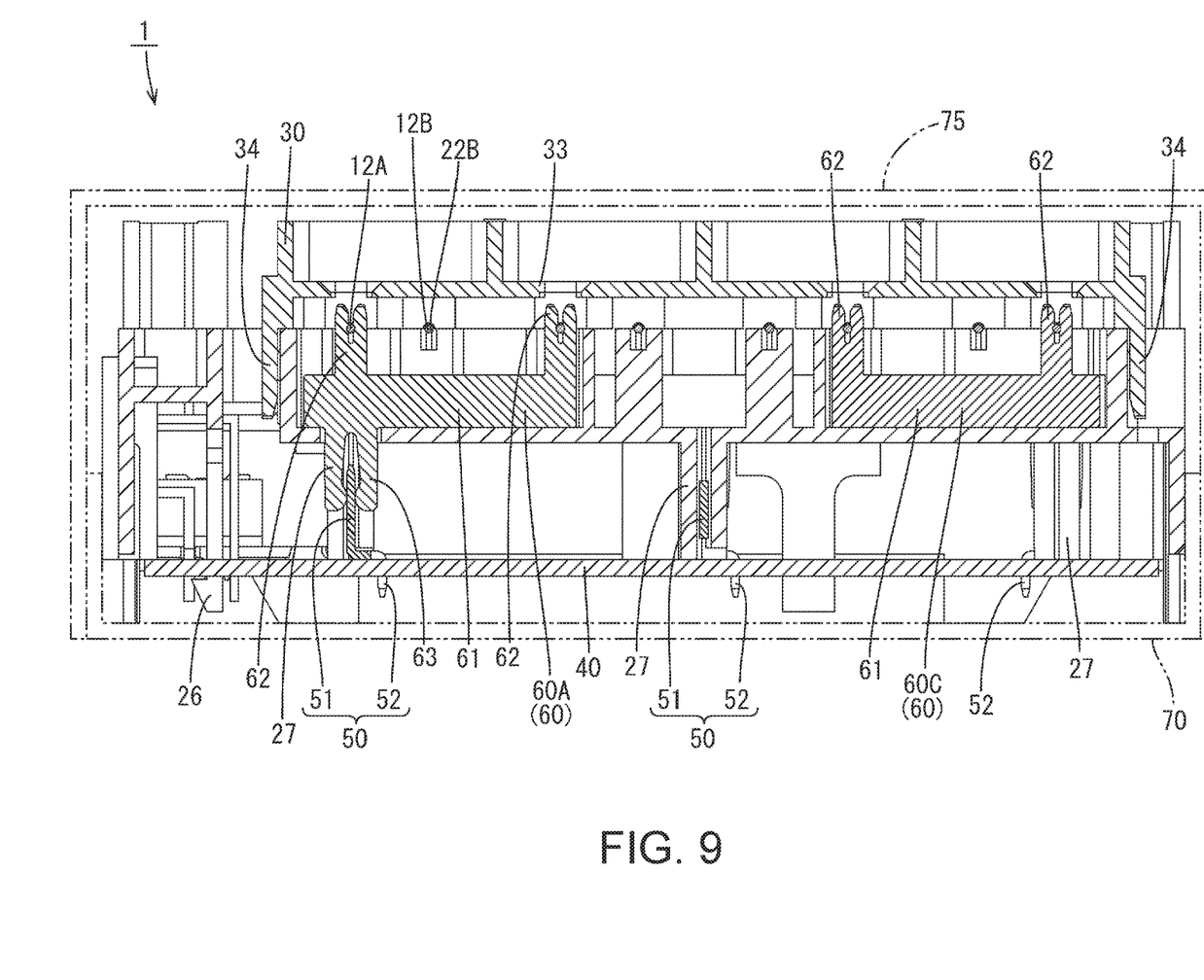
FIG. 9 is a cross-sectional view taken along the line B-B in FIG. 7.
Figure 10:
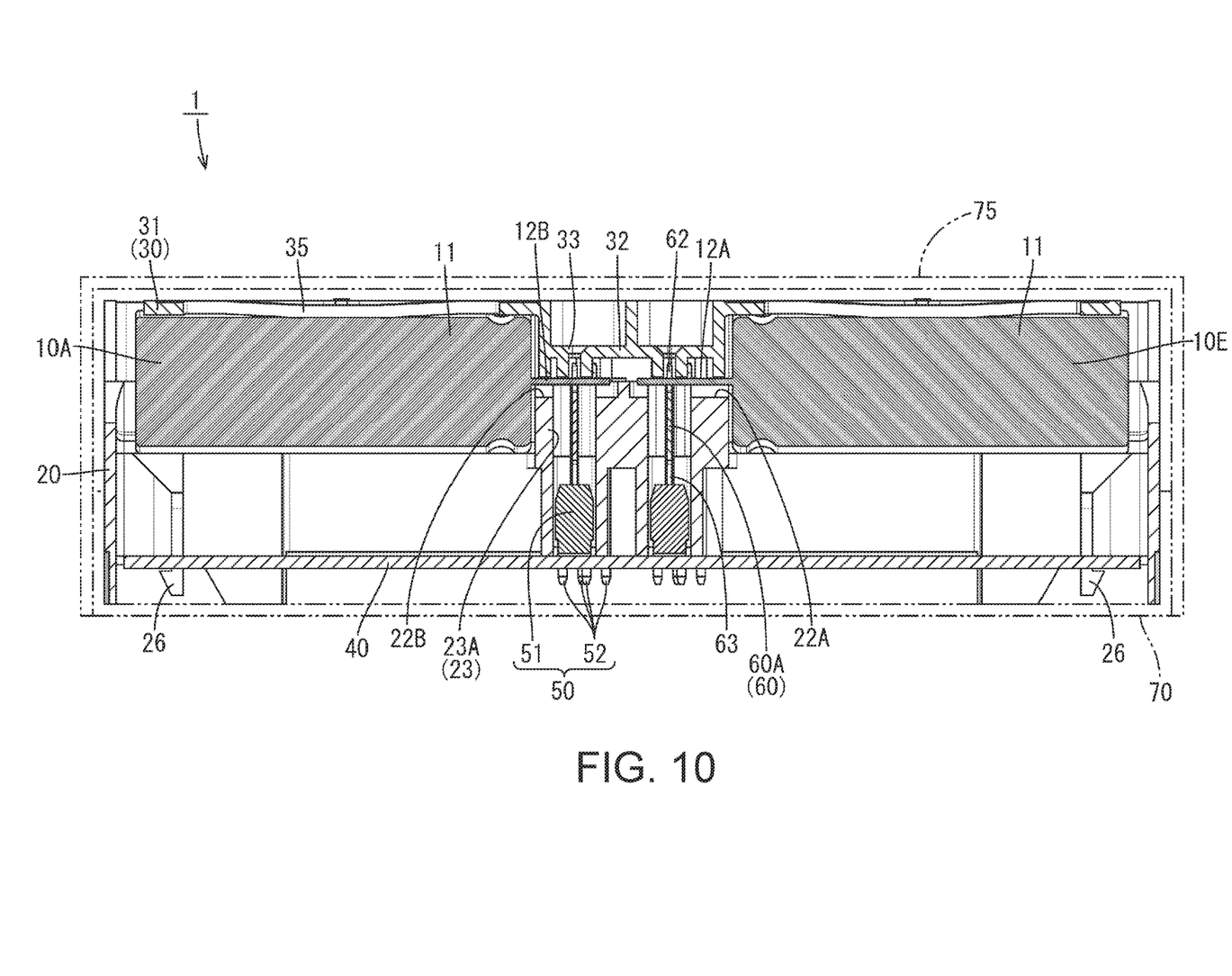
FIG. 10 is a cross-sectional view taken along the line C-C in FIG. 7.

As shown in FIG. 1, the auxiliary power supply device 1 includes a plurality of (eight in the present embodiment) capacitors 10A to 10H (an example of the electricity storage element), a resin holder 20 that holds the capacitors 10A to 1011, and a cover 30 that is to be locked to the holder 20 so as to cover the upper surfaces of the capacitors 10A to 10H. As shown in FIGS. 8 to 10, the lower face of the holder 20 is locked to a circuit board 40, and relay terminals 50 are attached to the circuit board 40. As shown in FIGS. 9 and 10, bus bars 60 (an example of a connecting member) are held by the holder 20, and a pair of lead terminals 12A and 12B that are guided out from the electricity storage body 11 of each of the capacitors 10A to 10H are connected to a corresponding bus bar 60.

Capacitors 10A to 10H

Figure 5:
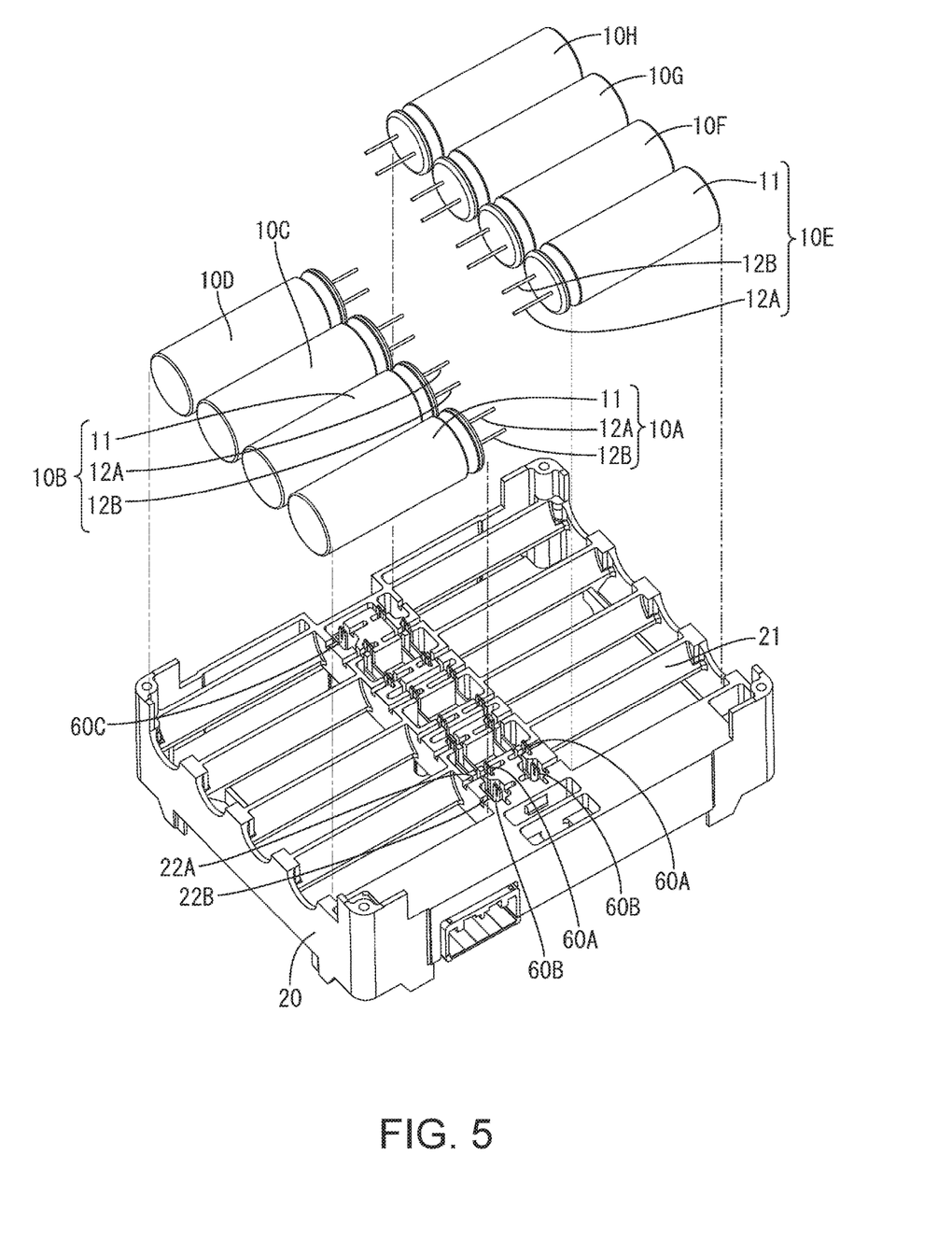
FIG. 5 is a perspective view showing a holder, etc. on which connecting members are disposed, and electricity storage elements that are to be held by the holder, etc.

As the capacitors 10A to 10H, it is preferable to use a capacitor that has a relatively large capacitance, such as an electric double layer capacitor or a lithium ion capacitor. As shown in FIG. 5, etc., each of the capacitors 10A to 10H includes a columnar electricity storage body 11 in which an electricity storage element is housed, a pair of lead terminals 12A and 12B (the positive electrode lead terminal is denoted as 12A, and the negative electrode lead terminal is denoted as 12B) that are guided out from an end face of the electricity storage body 11. The lead terminals 12A and 12B are elongated columnar pieces of metal, and linearly extend in the axial direction of the electricity storage body 11. In the present embodiment, of the pair of lead terminals 12A and 12B, the positive electrode lead terminal 12A is formed to have an extension length longer than the extension length of the negative electrode lead terminal 12B.

Bus Bar 60

Figure 4:
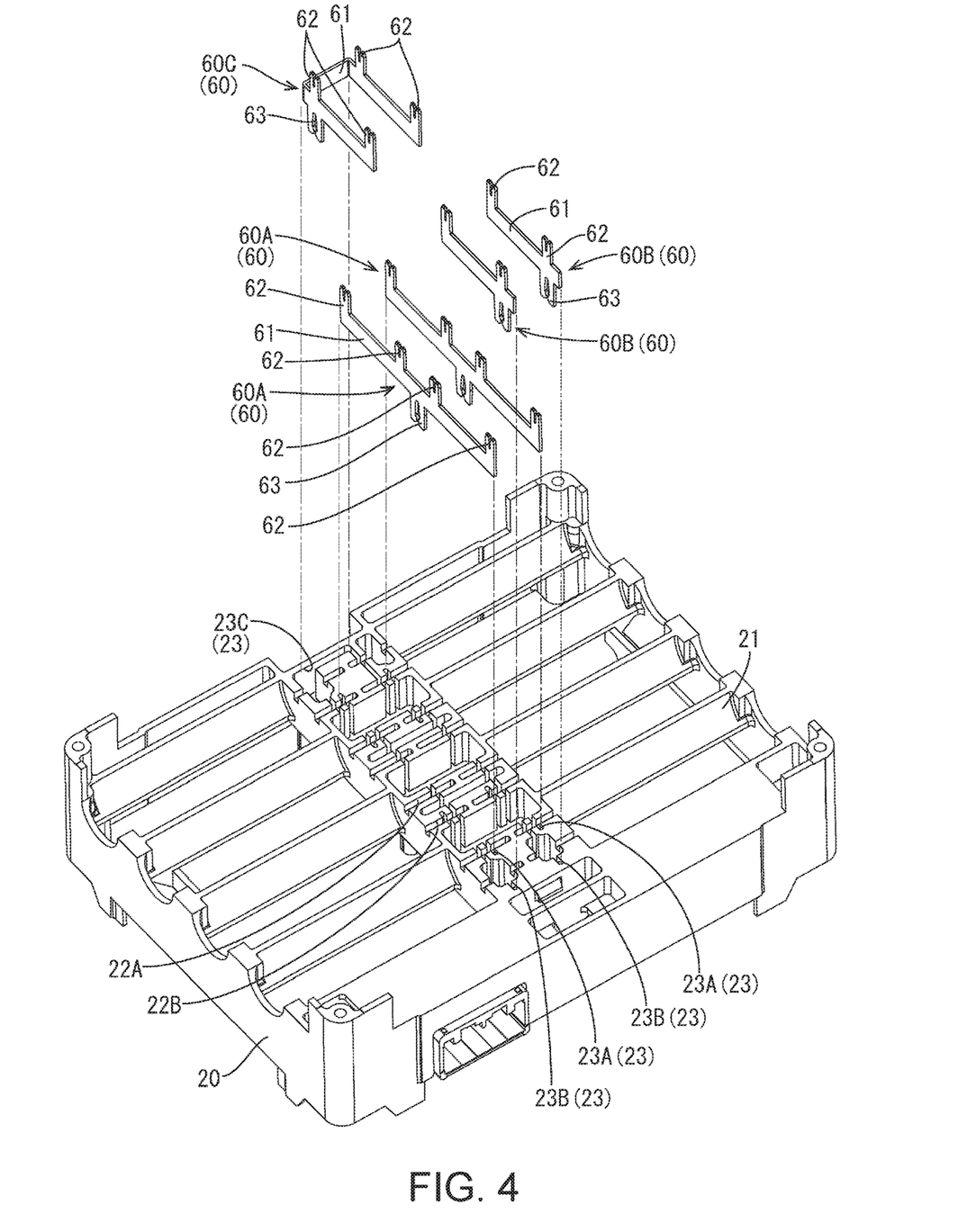
FIG. 4 is a perspective view showing a holder attached to a circuit board, and connecting members that are to be disposed on the holder.

Each bus bar 60 can be formed by punching a conductive metal plate made of copper, a copper alloy, stainless steel (SUS) or the like, and, as needed, deforming the metal plate so as to be bent. As shown in FIG. 4, in the present embodiment, a total of five bus bars of three different kinds, namely, two long bus bars 60A, two short bus bars 60B formed in a flat plate shape, and one bent bus bar 60C formed by bending a bus bar with an external shape similar to that of the long bus bar 60A into a U-shape are used as the bus bars 60. In the following description, when the long bus bars 60A, the short bus bars 60B, and the bent bus bar 60C are collectively referred to, without being distinguished from each other, they are referred to as "bus bar 60" (the same applies to a bus bar holding portion 23, which will be described later). Each bus bar 60 is shaped such that a plurality of lead terminal connection portions 62 protrude upward, and one relay terminal fitting portion 63 (fitting portion) protrudes downward, all in a tuning fork-like shape protruding from a bar plate-shaped body portion 61. Four lead terminal connection portions 62 are formed on each long bus bar 60A and the bent bus bar 60C, and two lead terminal connection portions 62 are formed on each short bus bar 60B.

Holder 20

Figure 3:
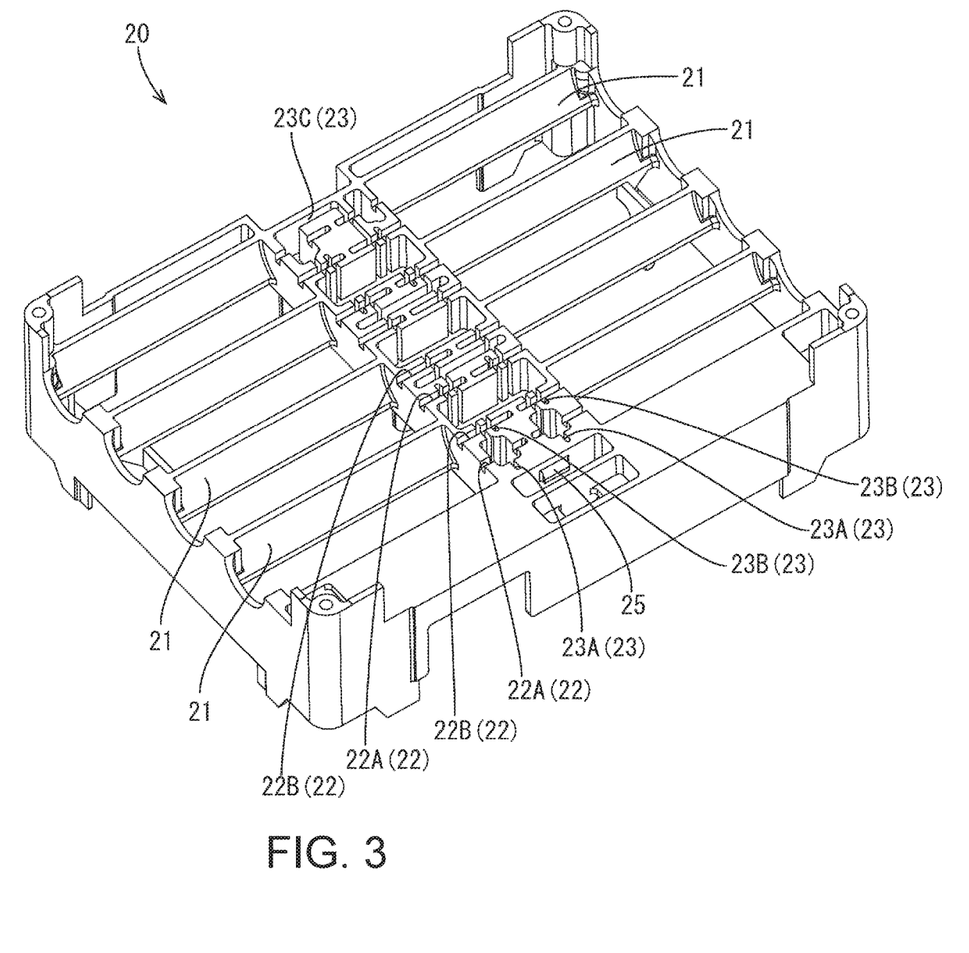
FIG. 3 is a perspective view of a holder.
Figure 6:
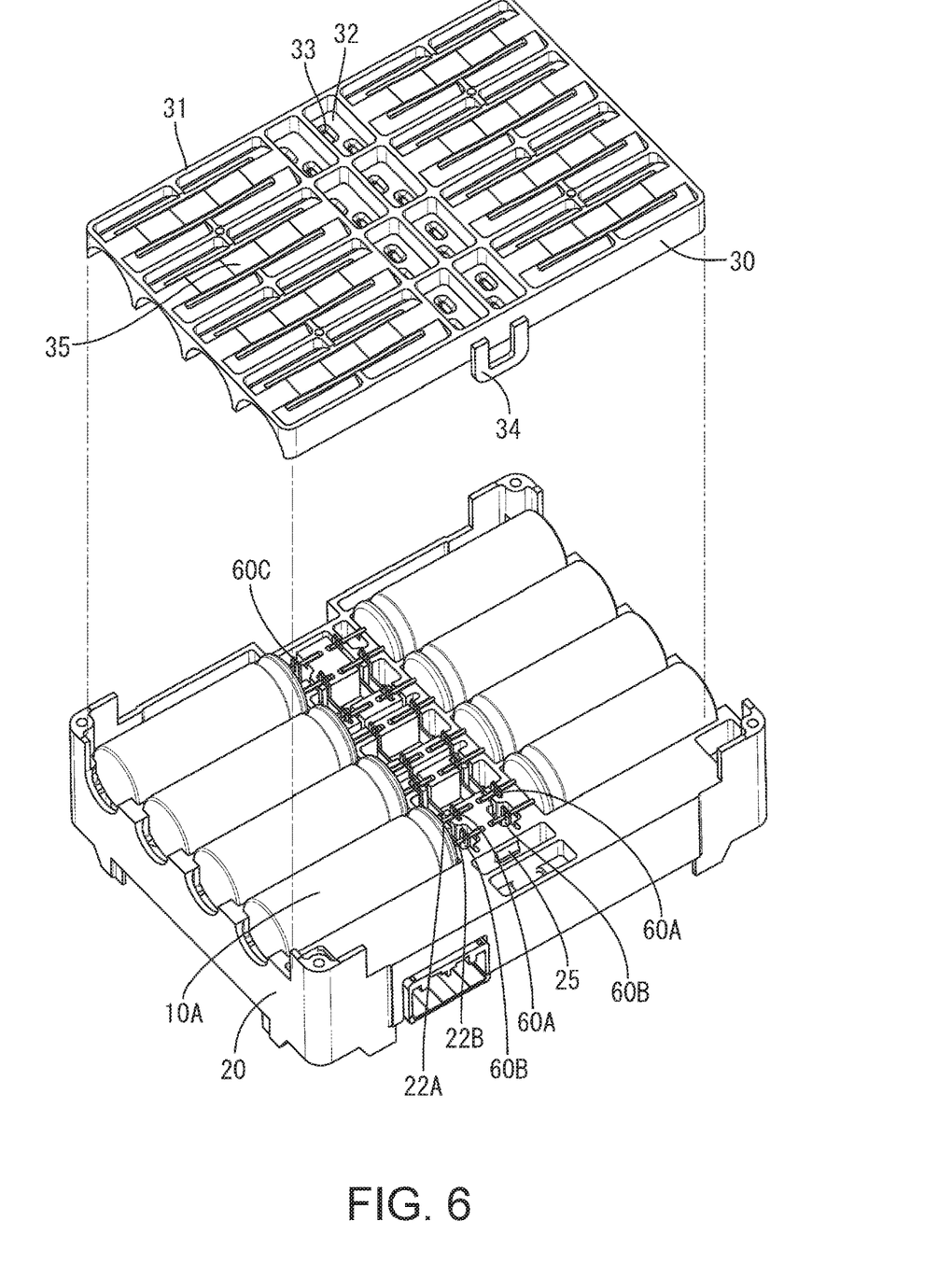
FIG. 6 is a perspective view showing a holder, etc. holding electricity storage elements, etc., and a cover that is to be locked to the holder, etc.
Figure 7:
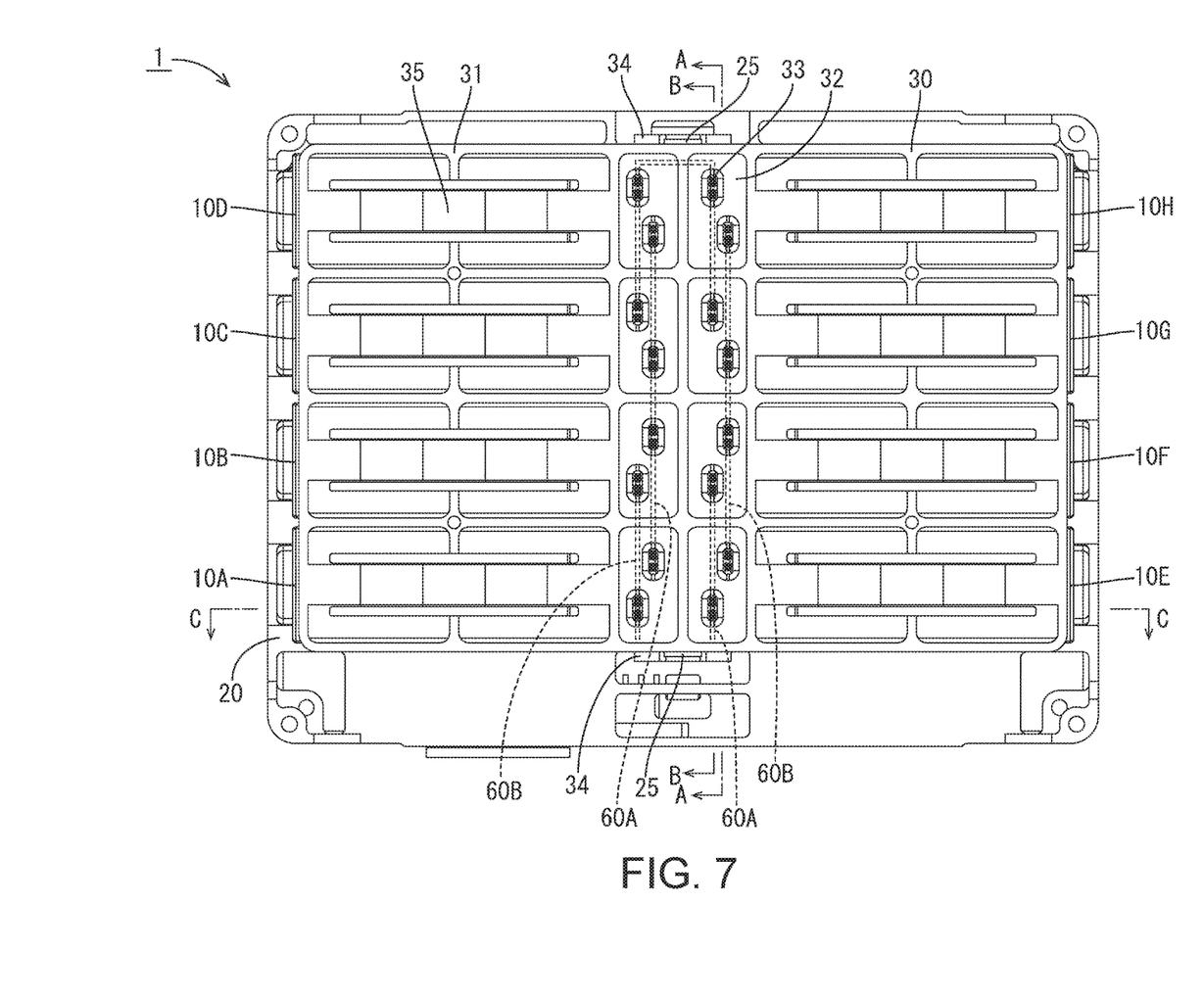
FIG. 7 is a plan view of FIG. 1.

The holder 20 is made of an insulating synthetic resin, and, as shown in FIG. 3, includes capacitor holding portions 21 (electricity storage element holding portions) that hold the electricity storage bodies 11 of the capacitors 10A to 10H, fitting groove portions 22A and 22B into which the lead terminals 12A and 12B are fitted and held, and bus bar holding portions 23 (connecting member holding portions) into which the bus bars 60 are inserted and held. As shown in FIGS. 8 and 9, leg portions 27 protruding downward are provided on the lower face of the holder 20 at positions corresponding to relay terminals 50 (described below) that are to be attached to the circuit board 40. Each leg portion 27 is provided so as to sandwich a body portion 51 of each relay terminal 50 from the front side and the rear side, and one of the front-side part and the rear side-part is formed to be shorter than the other. Accordingly, the lower end face of the longer part abuts against the surface of the circuit board 40 so as to define an interval between the circuit board 40 and the holder 20, and the shorter part is disposed on the upper side of the locking leg portion 52 of a relay terminal 50 so as to extend along the body portion 51, thus preventing the relay terminal 50 from being positionally displaced or collapsing. As shown in FIGS. 8 to 10, a locking projection 26 protruding downward is provided at a position corresponding to a locking hole 43 of the circuit board 40, which will be described later, and a screw-retaining hole (not shown) is formed at a position corresponding to a screw hole 42. By locking the locking projection 26 to the locking hole 43 and screwing a screw into the screw-retaining hole and the screw hole 42, the lower face of the holder 20 is fixed to the circuit board 40. As shown in FIGS. 6 and 7, locking protruding portions 25 are provided on the front side and the rear side of a central part in the left-right direction where the fitting groove portions 22A and 22B and the bus bar holding portions 23 are provided, and locking pieces 34 of the cover 30, which will be described later, are locked to the locking protruding portions 25.

The capacitor holding portions 21 have side walls that are curved into a circular arc shape so as to come into close contact with the external shape of the columnar electricity storage bodies of the capacitors 10A to 10H. The capacitor holding portions 21 are formed such that the four capacitors 10A to 10D and the four capacitors 10E to 10H arranged front to rear are held at positions toward the left and right side edges, respectively, of the upper face of the holder 20 in an orientation in which the axial direction of the electricity storage bodies 11 coincides with the left-right direction. The capacitors 10A to 10D in the left row and the capacitors 10E to 10H in the right row are arranged such that their lead terminals 12A and 12B oppose each other on the inner side. In the present embodiment, the lead terminals 12A and 12B are arranged such that the positive electrode lead terminal 12A and the negative electrode lead terminal 12B are adjacent to each other in the front-rear direction, and the positive electrode lead terminal 12A and the negative electrode lead terminal 12B oppose each other in the left-right direction. By arranging the positive electrode lead terminal 12A with a longer extension length and the negative electrode lead terminal 12B with a shorter extension length so as to oppose each other in this manner, it is possible to use the upper face of the holder 20 without any waste, thus saving space.

The fitting groove portions 22A and 22B are formed between the left and right rows of the capacitor holding portions 21, as grooves extending so as to oppose each other in the left-right direction from the inner end faces of the capacitor holding portions 21. The fitting groove portions 22A and 22B are formed to have two different lengths in accordance with the extension lengths of the lead terminals 12A and 12B, and are formed such that the fitting groove portion 22A and the fitting groove portion 22B are adjacent to each other in the front-rear direction, and the fitting groove portions 22A and the fitting groove portion 22B oppose each other in the left-right direction.

As shown in FIG. 3, in the present embodiment, two long bus bar holding portions 23A and two short bus bar holding portions 23B extending linearly in the front-rear direction so as to traverse the plurality of fitting groove portions 22A and 22B, and a bent bus bar holding portion 23C that is formed in a U-shape so as to connect the rear parts of the short bus bar holding portions 23B are formed as the bus bar holding portions 23. Each bus bar holding portion 23 is sized such that the corresponding bus bar 60 can be disposed in the bar holding portion 23 with a clearance. As shown in FIGS. 4 and 7, etc, the bus bar 60 is held by the corresponding bus bar holding portion 23, and the lead terminals 12A and 12B are pressed into and connected to the lead terminal connection portion 62 of the bus bar 60. Consequently, for example, the capacitor 10A and the capacitor 10B are connected in parallel by a long bus bar 60A and a short bus bar 60B, and are connected in series, by another long bus bar 60A, to the capacitor 10C and the capacitor 10D that are also connected in parallel by the bent bus bar 60C and another long bus bar 60A. Then, the capacitors 10A to 10H arranged from the front to rear and left to right are connected in series-parallel as a whole.

Circuit Board 40

Figure 2:
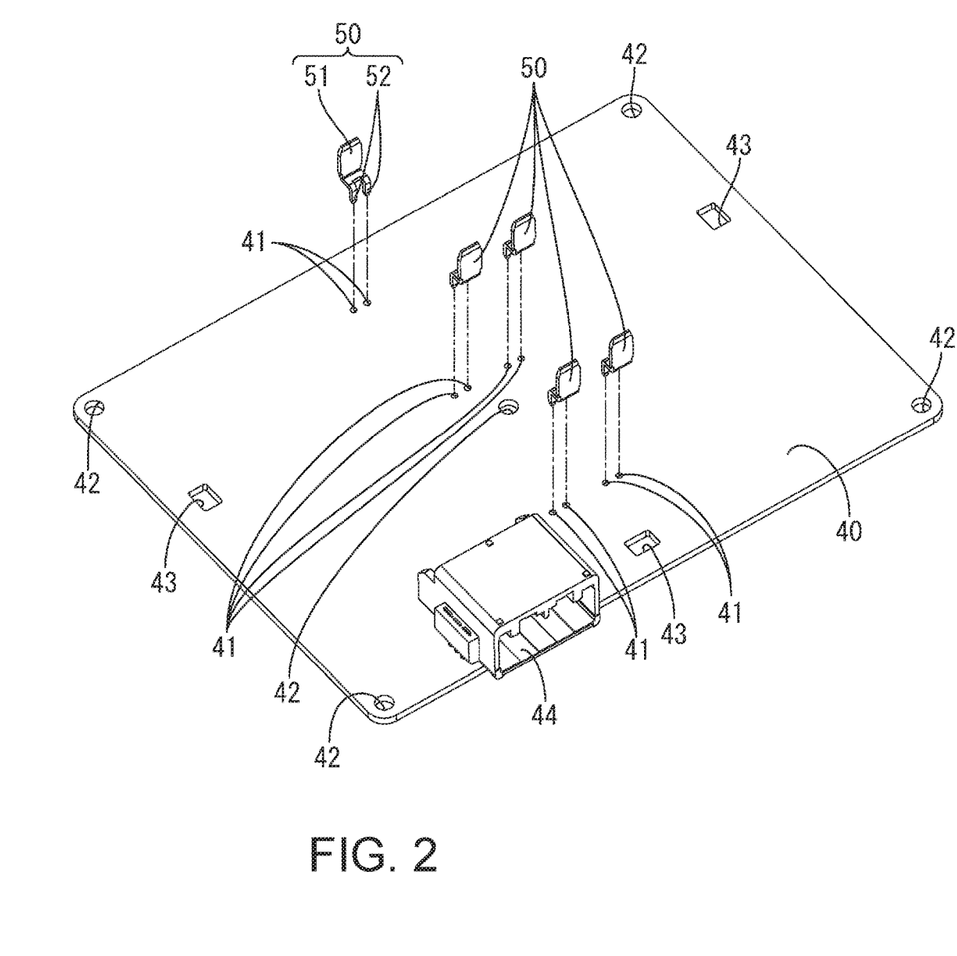
FIG. 2 is a perspective view showing a circuit board and relay terminals that are to be attached to the circuit board.

The circuit board 40 is a substantially rectangular, printed circuit board in which a conductive path made of a copper foil (not shown) is printed on an insulating plate. As shown in FIG. 2, a plurality of pairs of through holes 41 are formed in the circuit board 40 at a central part in the left-right direction at appropriate intervals. Screw holes 42 for screwing screws to the holder 20 are formed extending through the circuit board 40 at four corners and a central part thereof. Also, locking holes 43 for allowing locking projections (not shown) of the holder 20 to be fitted and locked thereto are formed extending through the circuit board 40 at a central part of the front edge and a central part of left and right side edges. Additionally, a connector fitting portion 44 for allowing a connector or the like to be externally fitted thereto is provided at a part located toward the left on the front edge of the circuit board 40.

Relay Terminal 50

Each relay terminal 50 is a conductive member made of metal, and, as shown in FIG. 2, has a shape in which two locking leg portions 52 extend in a bent state from a lower portion of a body portion 51 having the shape of a rectangular tab. In the present embodiment, five relay terminals 50 are used, and each of the relay terminals 50 is attached in a state in which each of the locking leg portions 52 are passed through a through hole 41 of the circuit board 40, and the body portion 51 protrudes upward.

Cover 30

The cover 30 is made of an insulating synthetic resin as with the holder 20, and, as shown in FIG. 6, can be locked to the holder 20 from above by locking locking pieces 34 formed on the front wall and the rear wall to the locking protruding portions 25. The cover 30 includes a capacitor abutment region 31 that covers the upper side of the capacitor holding portion 21, and a connection part covering region 32 that covers the upper side of the fitting groove portions 22A and 22B and the bus bar holding portions 23. In the capacitor abutment region 31, elastic abutment pieces 35 are formed, each of which is capable of elastically deforming in the vertical direction as a result of portions disposed between a plurality of pairs of slits being bent downward. Accordingly, when the cover 30 is locked to the holder 20, the elastic abutment pieces 35 press the upper parts of the electricity storage bodies 11 of the capacitors 10A to 10H held by the holder 20. In the connection part covering region 32, viewing holes 33 are open such that the state of connection between the lead terminals 12A and 12B and the lead terminal connection portions 62 of the bus bars 60 can be viewed in a state in which the cover 30 is locked to the holder 20.

Method for Assembling Auxiliary Power Supply Device 1

Next, an example of the method for assembling the auxiliary power supply device 1 according to the present embodiment will be described.

First, as shown in FIG. 2, the locking leg portions 52 of each relay terminal 50 are passed through the through holes 41 of the circuit board 40, and reflow soldering is performed to connect the relay terminals 50 to the conductive path formed on the circuit board 40. This step may be performed simultaneously with mounting and soldering of another electronic component or the like.

Then, the holder 20 shown in FIG. 3 is disposed on the circuit board 40 from above so as to lock the locking projections 26 to the locking holes 43, and the holder 20 is attached to the circuit board 40 by screwing screws into the screw-retaining holes and the screw holes 42.

Thereafter, as shown in FIG. 4, the bus bars 60 are disposed in the bus bar holding portions 23 of the holder 20. At this time, while appropriately positioning the bus bars 60 disposed in the bus bar holding portions 23 with a clearance, the upper ends of the body portions 51 of the relay terminals 50 attached to the circuit board 40 are fitted and locked to the relay terminal fitting portions 63, which are formed in a tuning fork-like shape, of the bus bars 60.

Then, as shown in FIG. 5, the lead terminals 12A and 12B are fitted into the fitting groove portions 22A and 22B while checking the lengths of the lead terminals 12A and 12B, and the electricity storage bodies 11 are disposed in the capacitor holding portions 21. Then, the lead terminals 12A and 12B are pressed and connected to the turning fork-shaped lead terminal connection portions 62 of the bus bars 60.

Finally, as shown in FIG. 6, the cover 30 is placed on the holder 20 from above, and the locking pieces 34 are locked to the locking protruding portions 25, thereby completing the assembly of the auxiliary power supply device 1. As indicated by the chain lines in FIGS. 8 to 10, the auxiliary power supply device 1 is mounted to a vehicle or the like in a state in which it is protected by being covered by a lower case 70 and an upper case 75 that are made of a resin or metal. The lower case 70 and the upper case 75 can be attached by fitting lock portions provided on side wall portions of the cases to each other. Alternatively, only the lower case 70 may be attached to the auxiliary power supply device 1 by screwing screws to through holes provided in locations corresponding to the screw holes 42 of the circuit board 40.

Actions and Effects

Next, the actions and effects of the present embodiment will be described.

With the auxiliary power supply device 1 according to the present embodiment, the relay terminals 50 can be connected to the conductive path of the circuit board 40 through reflow soldering, in a state in which the capacitors 10A to 10H are not connected. Thereafter, the relay terminal fitting portions 63 of the bus bars 60 are fitted to the body portions 51 of the relay terminals 50, and the lead terminals 12A and 12B are connected to the lead terminal connection portions 62 of the bus bars 60. Accordingly, it is possible to prevent the capacitors 10A to 10H from being affected by heat during reflow soldering. Since this allows the relay terminals 50 to be soldered simultaneously when mounting the electronic components, soldering in a subsequent step is not necessary, thus making it possible to perform the soldering step in one go. Consequently, a solder testing step can also be performed in one go, and therefore the number of man-hours can also be significantly reduced.

The auxiliary power supply device 1 according to the present embodiment has a configuration in which the lead terminals 12A and 12B and the conductive circuit of the circuit board 40 are connected via the bus bars 60 and the relay terminals 50, and variations in dimensions between the members and changes in dimensions during expansion and contraction caused by heat can be absorbed at these connection locations. In particular, in the present embodiment, the bus bars 60 are held by the bus bar holding portions 23 with a clearance, and therefore the operation of fitting the relay terminals 50 to the relay terminal fitting portions 63 of the bus bars 60 can be performed with a certain degree of freedom. This eliminates the need for precise positioning between the circuit board 40 and the holder 20 that holds the capacitors 10A to 10H, thus making it possible to significantly improve the mounting operability, and to reduce the stress exerted on edge portions of the solder and the through holes 41. It is not necessary to pass the lead terminals 12A and 12B through the through holes 41 of the circuit board 40, and to perform a forming step of bending the lead terminals 12A and 12B into an L-shape. Accordingly, the operation of connecting the lead terminals 12A and 12B to the conductive path is further simplified.

Each of the bus bars 60 according to the present embodiment includes a relay terminal fitting portion 63 protruding downward in a tuning fork-like shape, and the upper end of the body portion 51 can be press-fitted into the relay terminal fitting portion 63, thus fixing the bus bar 60 to the relay terminal 50. This makes it possible to place each of the bus bars 60 in the auxiliary power supply device 1 in a state in which the bus bar 60 is in reliable contact with the relay terminal 50, thus simplifying the operation of connecting the lead terminals 12A and 12B to the conductive path of the circuit board 40, while ensuring the connection reliability.

With the auxiliary power supply device 1 according to the present embodiment, the number of relay terminals 50 required is reduced to five by achieving connection between eight pairs of lead terminals 12A and 12B by using five bus bars 60, thus significantly reducing the number of connection locations between the bus bars 60 and the relay terminals 50, and the number of connection locations between the conductive path and the relay terminals 50, as compared with the number of lead terminals 12A and 12B. This makes it possible to reduce the number of components, and to significantly simplify the operation of electrically connecting the lead terminals 12A and 12B to the conductive path, as compared with a configuration in which the lead terminals 12A and 12B are separately connected to the conductive path of the circuit board 40.

With the auxiliary power supply device 1 according to the present embodiment, connection to the bus bars 60 can be easily achieved by fixing the capacitors 10A to 10H and the lead terminals 12A and 12B to the holder 20. At the same time, the influence exerted on the capacitors 10A to 10H and the lead terminals 12A and 12B by vibrations and the like at the time of mounting the auxiliary power supply device 1 to a vehicle is suppressed, resulting in improved durability and connection reliability.

With the auxiliary power supply device 1 according to the present embodiment, the bus bars 60 can be held in a state in which the lead terminals 12A and 12B are connected by also placing the bus bars 60 on the holder 20 holding the lead terminals 12A and 12B and the capacitors 10A to 10H. Accordingly, the relative arrangement between the capacitors 10A to 10H, the lead terminals 12A and 12B, and the bus bars 60 can be defined, thus inhibiting a situation in which excess stress is exerted on the connection portions between the lead terminals 12A and 12B and the bus bars 60.

The lead terminals 12A and 12B according to the present embodiment are formed to have different extension lengths, and the holder 20 includes fitting groove portions 22A and 22B having lengths corresponding to the lead terminals 12A and 12B. Accordingly, to which of the fitting groove portions 22A and 22B the lead terminals 12A and 12B should be fitted into can be easily determined, and it is therefore possible to improve the assembly operability.

With the auxiliary power supply device 1 according to the present embodiment, the cover 30 is locked to the holder 20, and the cover 30 includes a capacitor abutment region 31 that abuts against the capacitors 10A to 10H held by the holder 20 from above, and a connection part covering region 32 that covers the connection portions between the bus bars 60 and the lead terminals 12A and 12B from above. The elastic abutment pieces 35 formed in the capacitor abutment region 31 presses the electricity storage bodies 11 of the capacitors 10A to 10H from above, and thus resonance caused by vibrations or the like can be suppressed. Also, due to the connection part covering region 32 covering the connection portions between the bus bars 60 and the lead terminals 12A and 12B, it is possible to inhibit protrusion of the connection portions caused by vibrations. Also, a situation in which excess stress is exerted on the base portions of the lead terminals 12A and 12B is inhibited, thus further improving the connection reliability against vibrations.

OTHER EMBODIMENTS

The technique disclosed herein is not limited to the embodiment described and illustrated above, and, for example, the following embodiments also fall within the technical scope.

(1) The auxiliary power supply device 1 may be any auxiliary power supply device including a plurality of capacitors 10A to 10H, and the shape, the number, and the arrangement of capacitors are not limited.

(2) The shape of the holder 20 is not limited. Depending on the case, the auxiliary power supply device 1 may not include the holder 20.

(3) The shape and the number of bus bars 60 and relay terminals 50 are not limited. The fewer the number of relay terminals 50, the fewer the number of components and the number of operation steps, and the simpler the connection operation can be.

(4) The connection method of the relay terminal 50 is not limited to soldering. For example, connection may be achieved by pressing. In this case, only the relay terminal 50 may be pressed into the circuit board 40, and thereafter the bus bars 60 connected to the lead terminals 12A and 12B may be brought into contact with the relay terminals 50.

(5) The assembly method of the auxiliary power supply device 1 is not limited. For example, the capacitors 10A to 10H, the lead terminals 12A and 12B, and the bus bars 60 connected to the lead terminals 12A and 12B may be held on the holder 20, and all of these components may be unitized as an electricity storage element unit, and the circuit board 40 to which the relay terminals 50 are connected is unitized as a circuit board unit. Then, the two units may be assembled together such that the bus bars 60 and the relay terminals 50 come into contact with each other.

The invention claimed is:
1. A power supply device comprising:
a plurality of electricity storage elements each including lead terminals;
a conductive connector connected to the lead terminals;
a circuit board including a conductive path;
a conductive relay terminal electrically connected to the conductive path, the connector being disposed so as to be in contact with the relay terminal; and
a resin holder configured to hold the plurality of electricity storage elements, wherein:
the holder includes an electricity storage element holder configured to hold the electricity storage elements, a connecting member holder configured to hold the connector, and a fitting groove into which the lead terminals can be fitted, and
the connecting member holder is formed so as to traverse the fitting groove.
2. The power supply device according to claim 1, wherein at least one of the connector and the relay terminal includes a fitting portion into which a part of the other of the connector and the relay terminal can be pressed and fitted.
3. The power supply device according to claim 1, wherein the connector is connected to a plurality of the lead terminals, and a number of the relay terminals is smaller than a number of the lead terminals.
4. The power supply device according to claim 1, wherein a pair of the lead terminals are guided out from each of the electricity storage elements so as to have extension lengths different from each other, and
the fitting groove is formed to have a length corresponding to the extension lengths of the lead terminals.
5. The power supply device according to claim 1, further comprising
a cover configured to be locked to the holder, wherein the cover is configured to:
come into abutment against the plurality of electricity storage elements held by the holder; and
be locked to the holder so as to cover a connection between the lead terminals and the connector.

* * * * *